United States Patent [19]

Kung et al.

[11] Patent Number: 4,654,859

[45] Date of Patent: Mar. 31, 1987

[54] FREQUENCY SYNTHESIZER FOR FREQUENCY HOPPING COMMUNICATION SYSTEM

[75] Inventors: Ching Y. Kung, Miami; Ronald L. Bentley, North Lauderdale, both of Fla.

[73] Assignee: Racal Data Communications Inc., Sunrise, Fla.

[21] Appl. No.: 849,624

[22] Filed: Apr. 9, 1986

[51] Int. Cl.$^4$ .................................................. H04L 27/30
[52] U.S. Cl. ................................. 375/1; 331/1 A; 331/18; 455/76
[58] Field of Search .................. 375/1, 48, 81, 82, 89; 455/76, 165, 183; 331/1 R, 1 A, 4, 25, 178

[56] References Cited

U.S. PATENT DOCUMENTS

| | | | |
|---|---|---|---|
| 3,155,908 | 11/1964 | Berman | 455/29 |
| 3,170,118 | 2/1965 | Logan | 370/69.1 |
| 3,584,303 | 6/1971 | Guanella | 455/38 |
| 3,824,468 | 7/1974 | Zegers et al. | 455/29 |
| 4,037,159 | 7/1977 | Martin | 375/1 |
| 4,061,973 | 12/1977 | Reimer et al. | 455/76 |
| 4,171,466 | 10/1979 | Carbrey | 328/27 |
| 4,222,115 | 9/1980 | Cooper et al. | 375/1 |
| 4,276,652 | 6/1981 | McCalmont et al. | 375/2.1 |
| 4,312,072 | 1/1982 | Vogel | 375/1 |
| 4,392,253 | 7/1983 | Yamada et al. | 331/1 A |
| 4,403,342 | 9/1983 | Borras et al. | 455/76 |
| 4,457,003 | 6/1984 | Reed | 375/1 |
| 4,468,792 | 8/1984 | Baker et al. | 375/1 |
| 4,479,226 | 10/1984 | Prabhu et al. | 375/1 |
| 4,512,035 | 4/1985 | Victor et al. | 455/165 |
| 4,583,231 | 4/1986 | Puckette | 375/1 |
| 4,602,225 | 7/1986 | Miller et al. | 455/76 |

Primary Examiner—Robert L. Griffin
Assistant Examiner—Stephen Chin
Attorney, Agent, or Firm—Jerry A. Miller

[57] ABSTRACT

A wireless data communications network utilizes a frequency synthesizer to achieve a systematic frequency hopping arrangement wherein frequency is incremented by two times the channel spacing from lowest frequency to highest frequency. When adjusting the frequency from highest frequency to lowest frequency a one times the channel spacing frequency hop is utilized for the first and half and last hop and two times the frequency spacing is utilized otherwise. In this manner, alternating frequencies are selected so that the same frequency is only utilized once during any complete cycle and the size of frequency transitions is held to a minimum allowing a narrow bandwidth filter and inexpensive implementation of the phase locked loop portion of the synthesizer.

13 Claims, 3 Drawing Figures

FREQUENCY SYNTHESIZER FOR FREQUENCY HOPPING COMMUNICATION SYSTEM

BACKGROUND OF THE INVENTION

1. Field of the Invention

This invention relates generally to the field of wireless data communications and more particularly to a wireless data communication network utilizing frequency hopping at radio frequencies.

2. Background of the Invention

Many possibilities exist for wireless data communication systems operating at various frequencies. At the low end of the frequency spectrum audio, ultrasonic and carrier current systems can provide safe low cost data communications. Unfortunately they suffer from limited data capacity and in some instances marginal performance. Higher frequency systems utilizing microwave to infrared and laser offer extremely large potential data capabilities. Unfortunately such high frequency systems which exhibit reasonable range, tend to be expensive and point to point in nature. They may also represent health hazards in some situations. A high frequency system that is dispersive enough not to be an eye hazard may be limited in range to the point that a wide degree of flexibility is unachievable. Also, such systems frequently suffer serious performance degradation in the presence of dust, rain, smoke or smog.

The intermediate spectrum of the radio frequency range offers a reasonable compromise between acoustic and optical systems in many instances. The drawback to this equipment is that it most frequently requires licensing from the Federal Communications Commission (FCC). This drawback can be avoided if the system is operated within the constraints defined presently by 47 CFR, Part 15, Section 122 which outlines the FCC Rules and Regulations concerning such systems.

These regulations allow for unlicensed operation in the frequency ranges of 40.66 to 40.70 megahertz and 70.00 megahertz and above providing that (among other things) each transmission is limited in duration to less than one second out of every 30 seconds and a duration of at least ten seconds between transmission at a particular frequency. It is therefore possible by adhering to these guidelines to produce a wireless data communications system which does not require FCC licensing and has appreciable data throughput.

While at first it appears that a simple frequency hopping transceiver system can be readily designed to meet the above limitations, a number of practical problems are encountered when attempting to design such a system. A careful examination of the regulations indicates that it is desirable to hop among at least 30 channels. To provide a reasonably high data rate the channels should be separated by at least 10 khz but this is not to be limiting. It is also desirable to utilize approximately the full one second allowed by the regulations on each individual frequency to minimize time wasted during hops. It is also desirable to provide such a system at a minimal cost and complexity.

In developing a system to meet these goals, most designs would invariably require rather large frequency changes at some point in time. In synthesizer designs, this presents a problem in acquiring fast lock in a phase locked loop synthesizer or rapid acquisition of the transmitted signal at the receiver when frequency changes are made. To avoid such problems, it is desirable to minimize the distance in frequency between frequency steps where possible. The present invention is directed toward this problem in particular.

The present invention effectively and inexpensively avoids this problem of attaining rapid frequency stability while adhering to the FCC Regulations so that maximal data throughput can be achieved without wasting valuable transmission time in allowing frequency synthesizers to settle or assuring that receiving have achieved lock.

SUMMARY OF THE INVENTION

It is an object of the present invention to provide an improved frequency hopping arrangement for data communications.

It is another object of the present invention to provide a frequency hopping arrangement that is suitable for unlicensed transmission at radio frequencies.

It is a further object of the present invention to provide an improved frequency synthesizer for data communications.

These and other objects of the invention will become apparent to those skilled in the art upon consideration of the following description of the invention.

In one embodiment of the present invention a method of frequency hopping frequency is a transmitter or receiver including a frequency synthesizer for generating a plurality of N output frequencies (F1–FN) where F(1) is the lowest of the output frequencies and F(N) is highest of the output frequencies and each of the N output frequencies F(J) is higher than the proceeding output frequency F(J−1). The method includes the steps of:

a. Setting the output frequency F(J) to F(1) for a predetermined time period;
b. Increasing the output frequency by setting F(J) equal to the lesser of F(N) and F(J+2);
c. Maintaining the frequency set in step (b) for a predetermined time period;
d. Repeating steps (b) and (c) until F(J) equals F(N);
e. Decreasing the output frequency by setting F(J) equal to the greater of F(1) and F(J−2);
f. Maintaining the frequencies set in step (e) for the predetermined time period; and
g. Repeating steps (e) and (f) until F(J) equals F(1).

Preferably 30 frequencies or more are used and each of the frequencies are separated from each other by at least 10 khz.

In another embodiment of the present invention, a frequency synthesizer includes a phase detector, a loop filter, a voltage controlled oscillator (VCO) and a programmable divider in a series configuration with the divider output coupled back to an input to the phase detector. A second input to the phase detector receives a stable source of reference frequency. A controller systematically adjusts the divide ratio of the programmable divider so that the output of the VCO alternates between:

a. increasing in steps of two times the frequency spacing so that alternating frequencies are unselected when the VCO output is increasing, and
b. increasing in steps of two times the frequency spacing so that the unselected frequencies are selected when the VCO output is decreasing; and
 wherein the controller may consecutively select the two adjacent frequencies at the uppermost or lowermost frequencies in order to transition from increasing to decreasing and decreasing to increasing.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DETAILED DESCRIPTION OF THE INVENTION

Figure 1:
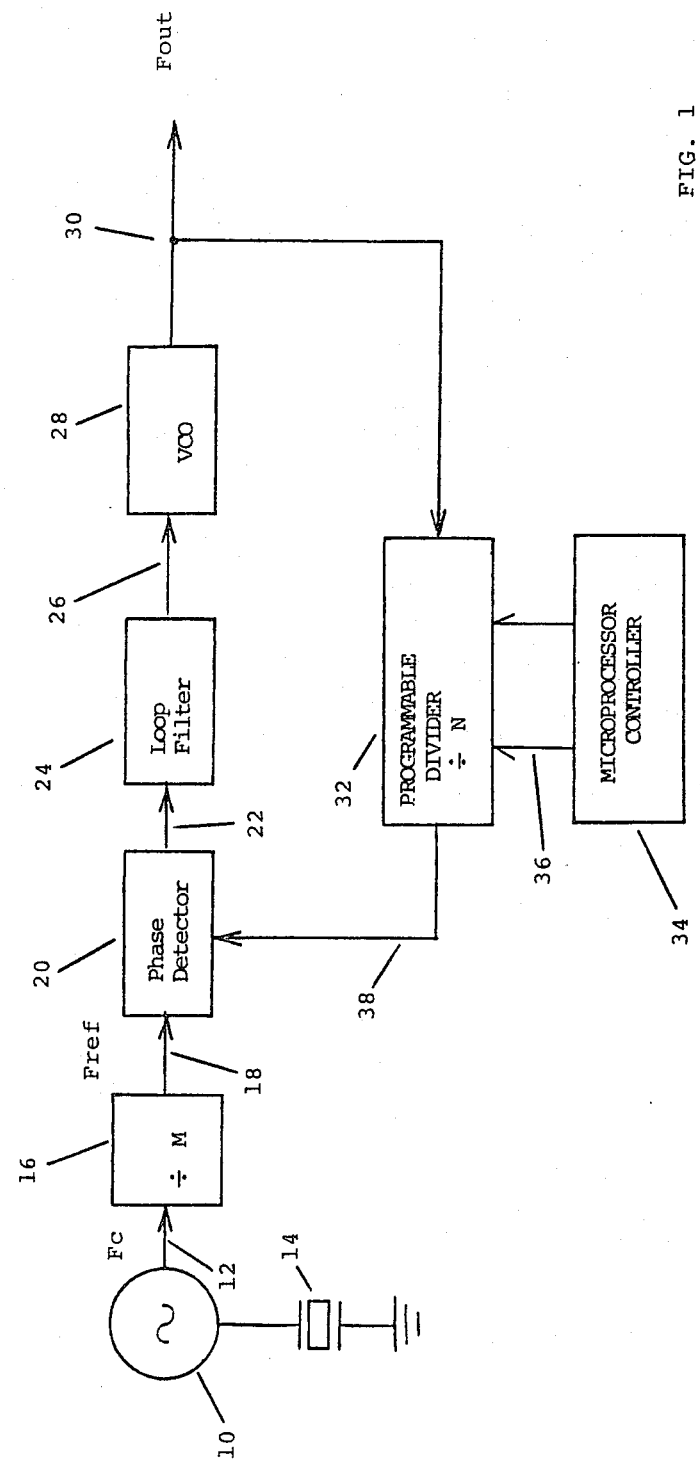
FIG. 1 is a frequency synthesizer as used in the present invention.

Turning now to FIG. 1 a frequency synthesizer suitable for use with the present frequency hopping system is shown. It will be understood by those skilled in the art that the present frequency synthesizer may be used as either a direct frequency generator for generating the carrier frequency or may be used as an intermediate frequency generator for subsequent multiplication by frequency multipliers or mixers. The preferred embodiment utilizes a high stability reference oscillator 10 which preferably derives its stable source of carrier frequency Fc present at node 12 from a quartz crystal 14. Fc at node 12 is divided by a divide by M divider 16 to produce an input reference frequency Fref at node 18 which is applied to a phase locked loop phase detector 20. The phase detector output at node 22 is applied to a loop filter 24 which is generally a low pass filter. The output of loop filter 24 at node 26 is applied to a voltage controlled oscillator 28.

An output of VCO 28 at node 30 provides the synthesizers output frequency Fout and is fed back to a programmable divider 32. Divider 32 is a divide by N counter where N is variable and controlled by a microprocessor based controller 34 coupled via one or more lines 36 to divider 32.

The output of divider 32 at node 38 is fed to a second input of phase detector 20 for comparison with the signal at node 18. The synthesizer system shown in FIG. 1 operates according to the following relationships:

Fref=Fc/M.
Fout=Fref*N=Fc*N/M.
Fref and M are constants.
Fout is adjusted by changing N.

The various considerations and tradeoffs in designing such phase-locked loop circuits are well known and described for example in "Phaselock Techniques", by Floyd M. Gardner, 1979, John Wiley & Sons, Inc. Those skilled in the art of phase locked loop design will recognize that one of the more critical design decisions in such a system involves the characteristics of filter 24. The phase locked loop will rapidly acquire lock as the system's frequencies are changed for the present frequency hopping scheme if a wide bandwidth loop filter is utilized. Unfortunately, those skilled in the art will also recognize that a narrower loop filter bandwidth is preferable from the point of view of enhancing the noise performance of the synthesizer. Since the loop bandwidth is directly related to the size of the frequency jump when hopping from one frequency to the next, it is preferable to reduce the size of such frequency jumps so that a narrower loop bandwidth can be used for enhanced noise immunity. This is achieved in the present invention by utilizing the frequency hopping scheme illustrated in FIGS. 2 and 3.

Figure 2:
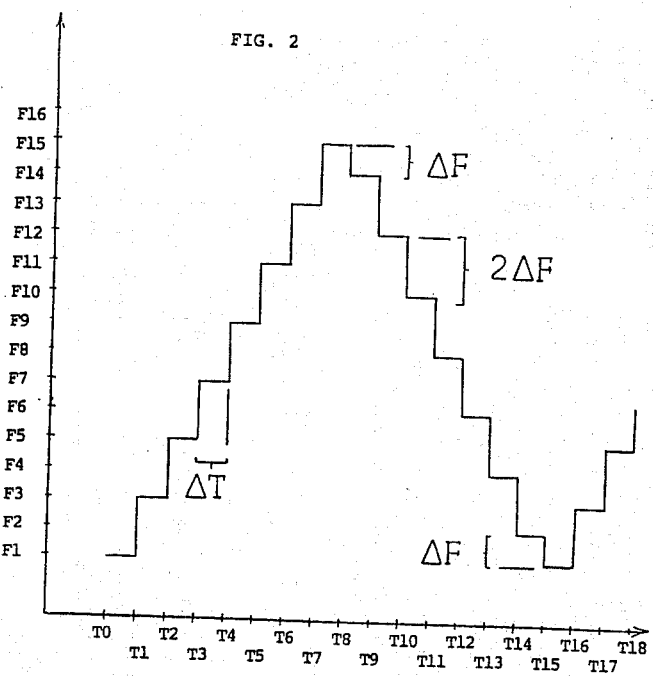
FIG. 2 is a graphical representation of the frequency hopping scheme of the present invention as applied to an odd number of frequencies.

Considering first the method of FIG. 2, it should be noted that there are several possible permutations of the present frequency hopping arrangement. FIG. 2 shows one technique for dealing with a system in which an odd number of frequencies are utilized. In this example, consider frequencies F1–F15 although it should be carefully noted that the invention is not limited to these numbers. At time T0 (which might represent powerup of the synthesizer) the frequency is set at F1 until time T1. In the preferred embodiment the time increment between T0 and T1 is preferably one second or slightly less and is referred to as ($\Delta T$). At time T1 the frequency is increased by a factor of $2*(\Delta F)$ where ($\Delta F$) is the distance in frequency between two adjacent frequencies. From times T1 through T7 the frequency is increased by a factor of $2*(\Delta F)$ at each time interval ($\Delta T$). At time T7, the upper most frequency is utilized. At time T8, the frequency is reduced by ($\Delta F$) rather than $2(\Delta F)$ in order to make the transition from increasing to decreasing. At time T9 and each time interval until T15, the frequency is reduced by a factor of $2*(\Delta F)$. At T15 the frequency is reduced by a factor of $1*(\Delta F)$ returning the synthesizer to the lowest frequency F1. By utilizing this staggering scheme, each frequency is utilized only once during a cycle from T0 through T15 yet frequency transitions are held to $2*(\Delta F)$ or less in all cases. Those frequencies which were occupied as the frequency was increasing upward are not occupied when the frequency is decreasing downward.

The microcomputer controller 34 may be programmed using codes similar to the following pseudocode in order to achieve this desired hopping of frequencies. It should be recognized that the actual frequency control occurs as a result of adjustment of the divide ratio of divider 32 in the preferred embodiment.

```
F: =F1;
OutputFrequency(F);
   Repeat
   For I: =1 to J DO
     Begin
     F: =F+2*DeltaF;
     OutputFrequency(F);
     End;
   F: =F−Delta F;
   OutputFrequency(F);
   For I: =1 to J−1 DO
     Begin
     F: =F−2*DeltaF;
     OutputFrequency(F);
     End;
   F: =F−DeltaF;
   OutputFrequency(F);
   Until PowerOff.
```

In the above pseudocode J represents the number of upward frequency transitions, F is the selected frequency, F1 is the starting frequency (lower most frequency) DeltaF is the channel spacing ($\Delta F$) and the routine referred to as OutputFrequency (F) is used by microprocessor controller 34 for setting programmable divider 32 to achieve a desired output frequency Fout for a time $\Delta T$.

Figure 3:
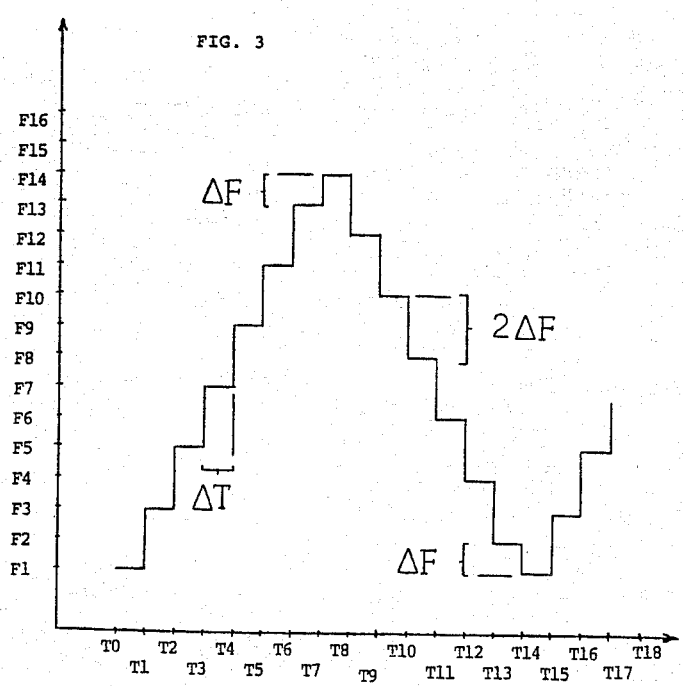
FIG. 3 shows a frequency hopping scheme according to the present invention as applied to an even number of frequencies.

Turning now to FIG. 3, a slightly different scheme may be utilized for a system utilizing an even number of frequencies. According to the preferred embodiment, 30 frequencies or more are utilized to comply with FCC regulations and allow for maximum time utilization at each frequency prior to hopping. In the method shown in FIG. 3, frequency hopping of 2*($\Delta$F) is used at frequency at times T1 through T6 and T8 through T13. At times T7 and T14 a frequency increment of ($\Delta$F) is utilized to achieve a similar staggering of frequencies to that achieved in FIG. 2. The following pseudocode can be used to implement the frequency hopping of FIG. 3.

```
F: =F1;
OutputFrequency(F);
  Repeat
    For I: =1 to J dO
      Begin
        F: =F+2*DeltaF;
        OutputFrequency(F);
      End;
    F: =F−DeltaF;
    OutputFrequency(F);
    For I: =1 to J−1 Do
      Begin
        F: =F−2*DeltaF;
        OutputFrequency(F);
      End;
    F: =F−DeltaF;
    OutputFrequency(F);
  Until PowerOff.
```

Those skilled in the art will recognize that a number of permutations of this scheme are possible without departing from the spirit of the invention. For example, in FIG. 3, a frequency hop of ($\Delta$F) may be utilized at T1 and 2*($\Delta$F) used at time T7 along with a ($\Delta$F) frequency jump at T8 and a 2*($\Delta$F) frequency jump at T14. Such variations clearly fall within the realm of the present invention.

Thus it is apparent that in accordance with the present invention an apparatus that fully satisfies the objectives, aims and advantages is set forth above. While the invention has been described in conjunction with a specific embodiment, it is evident that many alternatives, modifications and variations will become apparent to those skilled in the art in light of the foregoing description. Accordingly, it is intended that the present invention embrace all such alternatives, modifications and variations as fall within the spirit and broad scope of the appended claims.

What is claimed is:

1. A frequency synthesizer, comprising:
   a phase detector having first and second inputs and an output;
   a loop filter connected to said output to produce a filtered signal;
   a voltage controlled oscillator (VCO) responsive to said filtered output for producing an output frequency;
   a programmable divider, having an adjustable divide ratio, receiving said output frequency and applying a divided frequency to said second input of said phase detector;
   a stable source of oscillations coupled to said first input of said phase detector;
   controller means for systematically adjusting the divide ratio of said programmable divider thereby selecting said output frequency from a group of N frequencies each separated from an adjacent frequency by a frequency spacing so that said output frequency alternates between:
   (a) increasing in steps of two times said frequency spacing so that alternating output frequencies are selected when said VCO output frequency is increasing thereby leaving frequencies adjacent said selected frequencies unselected; and
   (b) decreasing in steps of two times the frequency spacing so that said output frequencies adjacent said frequencies which were selected in part (a) are selected when said VCO output frequency is decreasing; and wherein said controller can consecutively select two adjacent channel frequencies at the uppermost or lowermost frequencies in order to make a transition (a) to (b) and (b) to (a).

2. The apparatus of claim 1, wherein an even number of output frequencies are selected by said controller.

3. The apparatus of claim 1, wherein at least 30 output frequencies are selected by said controller.

4. The apparatus of claim 1, wherein each of said frequencies are selected for no longer than one second.

5. A method of hopping output frequency in a device including a frequency source for generating a plurality of N output frequencies F(1) through F(N) where N is an even integer, F(1) is the lowest of said output frequencies and F(N) is the highest of said output frequencies and each of said N output frequencies F(J) is higher than the proceeding output frequency F(J−1), said method comprising the steps of:
   (a) setting said output frequency F(J) to F(1) for a predetermined time period;
   (b) increasing said output frequency by setting F(J)=the lesser of F(N) and F(J+2);
   (c) maintaining the frequency set in step (b) for said predetermined time period;
   (d) repeating steps (b) and (c) until F(J)=F(N);
   (e) decreasing said output frequency by setting F(J)=the greater of F(1) and F(J−2);
   (f) maintaining the frequency set in step (e) for said predetermined time period; and
   (g) repeating steps (e) and (f) until F(J)=F(1).

6. The method of claim 5 wherein said predetermined time period is less than or equal to one second.

7. The method of claim 5 wherein N is greater than or equal to 30.

8. The method of claim 5 wherein said N frequencies are separated from each other by at least 10 Khz.

9. The method of claim 5 further including the steps of repeating steps (a) through (g).

10. A method of hopping output frequency in a device including a frequency source for generating a plurality of N output frequencies F(1) through F(N) where N is an odd integer, F(1) is the lowest of said output frequencies and F(N) is the highest of said output frequencies and each of said N output frequencies F(J) is higher than the proceeding output frequency F(J−1), said method comprising the steps of:
   (a) setting said output frequency F(J) to F(1) for a predetermined time period;
   (b) increasing said output frequency by setting F(J)=F(J+2);
   (c) maintaining the frequency set in step (b) for said predetermined time period;
   (d) repeating steps (b) and (c) until F(J)=F(N);
   (e) setting said output frequency to F(N−1) for said predetermined time period;
   (f) decreasing said output frequency by setting f(J)=the greater of F(1) and F(J−2);

(g) maintaining the frequency set in step (f) for said predetermined time period; and (h) repeating steps (f) and (g) until F(J)=F(1).

11. The method of claim 10 wherein said predetermined time period is less than or equal to one second.

12. The method of claim 10 wherein N is greater than or equal to 30.

13. The apparatus of claim 10, wherein each of said frequencies are selected for no longer than one second.

* * * * *